(12) United States Patent
Kim et al.

(10) Patent No.: US 6,498,529 B1
(45) Date of Patent: Dec. 24, 2002

(54) METHOD AND APPARATUS FOR CALCULATING THE PREDISTORTION FUNCTION FROM A POWER AMPLIFIER

(75) Inventors: Jaehyeong Kim, Pine Brook, NJ (US); Kyriaki Konstantinou, Madison, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/878,038

(22) Filed: Jun. 8, 2001

(51) Int. Cl.[7] .............................. G01R 19/00; H03F 1/26
(52) U.S. Cl. ........................................... 330/2; 330/149
(58) Field of Search ...................... 330/2, 149; 375/297

(56) References Cited

U.S. PATENT DOCUMENTS

| | | | | |
|---|---|---|---|---|
| 6,072,364 A | * | 6/2000 | Jeckeln et al. | 330/149 |
| 6,141,390 A | * | 10/2000 | Cova | 330/149 |
| 6,236,837 B1 | * | 5/2001 | Midya | 330/149 |
| 6,239,657 B1 | * | 5/2001 | Bauer | 330/149 |
| 6,240,278 B1 | * | 5/2001 | Midya et al. | 330/149 |

* cited by examiner

Primary Examiner—Benny Lee
Assistant Examiner—Khanh Van Nguyen
(74) Attorney, Agent, or Firm—Harness, Dickey & Pierce, P.L.C.

(57) ABSTRACT

Disclosed is an apparatus and method for iteratively calculating the predistortion function from a power amplifier when the inverse to the power amplifier characterization does not exist analytically. A predistortion module generates a predistorted signal in response to an input signal and a predistortion function received from a predistortion function calculating module. The predistortion function calculating module generates the predistortion function in response to given amplifier characteristics. In particular, the predistortion function calculating module uses a magnitude of the input signal at a given time to estimate the predistorted signal at that given time in order to calculate the predistortion function. Optionally, subsequent iterations based on the magnitude of the estimate occur until a desired accuracy of the predistorted signal approximation and of the predistortion function is achieved.

22 Claims, 2 Drawing Sheets

METHOD AND APPARATUS FOR CALCULATING THE PREDISTORTION FUNCTION FROM A POWER AMPLIFIER

RELATED APPLICATIONS

The present patent application is related to U.S. patent application Ser. No. 09/816,696, entitled, "METHOD AND APPARATUS FOR MODELING AND ESTIMATING THE CHARACTERISTICS OF A POWER AMPLIFIER BY RETAINING EVEN-ORDER TERMS IN ESTIMATING CHARACTERISTICS", being concurrently filed herewith and having a filing date of Jun. 7, 2001; to U.S. patent application Ser. No. 09/876,772, entitled, "METHOD AND APPARATUS FOR MODELING AND ESTIMATING THE CHARACTERISTICS OF A POWER AMPLIFIER", being concurrently filed herewith and having a filing date of Jun. 7, 2001; and to U.S. patent application Ser. No. 09/878,037, entitled, "METHOD AND APPARATUS FOR CALCULATING THE PREDISTORTION FUNCTION FROM A POWER AMPLIFIER MODEL", being concurrently filed herewith and having a filing date of Jun. 8, 2001; all of which have a common inventor and assignee and being incorporated herein by reference.

FIELD OF THE INVENTION

The present invention relates to a method and apparatus for providing a predistortion function in a power amplifier.

BACKGROUND OF THE INVENTION

In the field of radio communication systems, it is a well-known problem that the power amplifiers present in transmission equipment operate in a non-linear fashion when the power amplifiers are operated near their peak output. As a result, the power amplifier introduces significant signal distortion that can appear in various forms. For example, if more than one signal is input into the power amplifier or power amplification stage, its non-linear characteristics can cause an undesirable multiplicative interaction of the signals being amplified, and the power amplifier's output can contain intermodulation products. These intermodulation products cause interference and crosstalk over the power amplifier's operational frequency range.

In power amplifier design, there is a trade off between distortion performance and efficiency. Linear amplifiers that operate under "Class A" conditions create little distortion but are inefficient, whereas nonlinear amplifiers operated under "Class C" conditions are reasonably efficient but introduce significant distortions. While both efficiency and distortion are important considerations in amplifier design, efficiency becomes increasingly important at high power levels. Because of their efficiency, nonlinear amplifiers are largely preferred, leaving the user with the problem of distortion.

In order to employ nonlinear power amplifiers, techniques have been used to improve linearity and thereby reduce the effects of interference and crosstalk. Linearity can be achieved by application of various linearization techniques that reduce the distortion caused by nonlinear amplification. Conventional amplifier linearization techniques can be broadly categorized as feedback, feedforward, or predistortion.

The last mentioned technique, predistortion, intentionally distorts the signal before the power amplifier so that the non-linearity of the power amplifier can be compensated. According to this technique, linearization is achieved by distorting an input signal according to a predistortion function in a manner that is inverse to the amplifier characteristic function. The predistortion technique can be applied at radio frequency (RF), intermediate frequency (IF), or at baseband.

In the baseband domain, the input signal information is at a much lower frequency, allowing digital methods to be employed. The predistortion function is applied to the input signal with the resulting predistorted signal being upconverted to IF and then finally to the RF carrier frequency. It is also possible to apply adaptive predistortion techniques where feedback from the output of the amplifier is used to update and correct the predistortion function.

The form of the predistortion function is dependent upon the model used to characterize the output of the amplifier. Predistortion functions in the baseband domain are typically implemented as a table of gain and phase weighting values within a digital signal processor. A Cartesian feedback method employs a quadrature representation of the signal being amplified. The incoming quadrature signals I and Q are compared to the feedback quadrature signals. Thus, there are two sets of coefficients, one for each quadrature channel, that are being updated to model the predistortion characteristics. In this manner, gain and phase non-linearities within the amplifier can be compensated. Performance is dependent on the size of the look up table and the number of bits used to represent the signal. Better performance and more adaptivity is achieved with larger look up tables and more bits albeit at the expense of longer processing times.

Predistortion functions are also modeled as polynomials. Here, the complex polynomial must be able to characterize the inverse of the amplifier, which may not analytically exist and which must then be approximated. In order to accurately estimate the inverse, the polynomial requires high order terms, with associated quantization errors and a less accurate polynomial fit.

Adaptive methods generally process and model current amplifier characteristics. The current output signal of the amplifier is contrasted against the current input signal to the amplifier. Past inputs are not considered. However, amplifier characteristics are dependent upon frequency due to the speed in which input signals change amplitude as a function of frequency. Exclusion of past inputs precludes modeling those changes and limits the accuracy with which the amplifier can be modeled, thereby limiting the bandwidth.

Accordingly, there is a need for a power amplifier predistortion system that can quickly and efficiently obtain an optimum predistortion function for frequency dependent amplifiers.

SUMMARY OF THE INVENTION

The present invention teaches an apparatus and method for calculating the predistortion function from a power amplifier. A predistortion module generates a predistorted signal in response to an input signal and a predistortion function. The predistortion function calculating module generates a predistortion function in response to given amplifier characteristics. To more readily calculate the predistortion function, the predistortion function calculating module uses a magnitude of the input signal at a given time as an estimate of the predistorted signal at that given time to calculate the predistortion function. For example, in calculating the inverse of an amplifier characteristic curve, the magnitude of the current signal sample can be a function of the magnitude of the current predistorted signal. By replacing the magnitude of the current predistorted signal sample with the magnitude of the current input signal sample, the predistorted signal can determined.

In an exemplary embodiment of the present device, the predistortion function calculating module, in calculating the predistortion function, estimates the magnitude of the predistorted signal on an iterative basis.

In another exemplary embodiment of the present device, time spaced samples of the predistorted signal are processed by an amplifier with memory, and corresponding time indexed coefficients are used in characterizing the amplifier and in the calculation of the predistortion function. Each time spaced sample of the predistorted signal is generated from a corresponding time spaced instance of the input signal.

Importantly, power amplifiers have memory and their characteristics depend upon signal frequencies. By including prior instances of the input signal, the present invention can model the impact of both current and past instances of the input signal and therefore model non-linear and frequency dependent aspects of the power amplifier.

By incorporating the frequency dependency of the power amplifier, the present invention allows efficient power amplifier operation at wider bandwidths where sensitivity to frequency is more problematic. The invention further enables power amplifiers to be operated in the nonlinear region near saturation, yet suppresses undesirable intermodulation products. Resort to a larger amplifier, to keep operation within the linear region, is avoided. Power amplifier sizes are kept small with associated cost savings, particularly important in the field of wireless communications.

The above factors make the present invention essential for effective power amplifier predistortion.

BRIEF DESCRIPTION OF THE FIGURES

For a better understanding of the present invention, reference may be had to the following description of exemplary embodiments thereof, considered in conjunction with the accompanying drawings, in which.

DETAILED DESCRIPTION OF THE DRAWINGS

The following description is presented to enable a person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and the scope of the invention. Thus, the present invention is not intended to be limited to the embodiments disclosed, but is to be accorded the widest scope consistent with the principles and features disclosed herein.

The specification initially discusses the general concept and principles of adaptive digital predistortion in view of the novel device for employing predistortion techniques. Exemplary embodiments of the present invention are then described.

Overview of Adaptive Power Amplifier Predistortion

Figure 1:
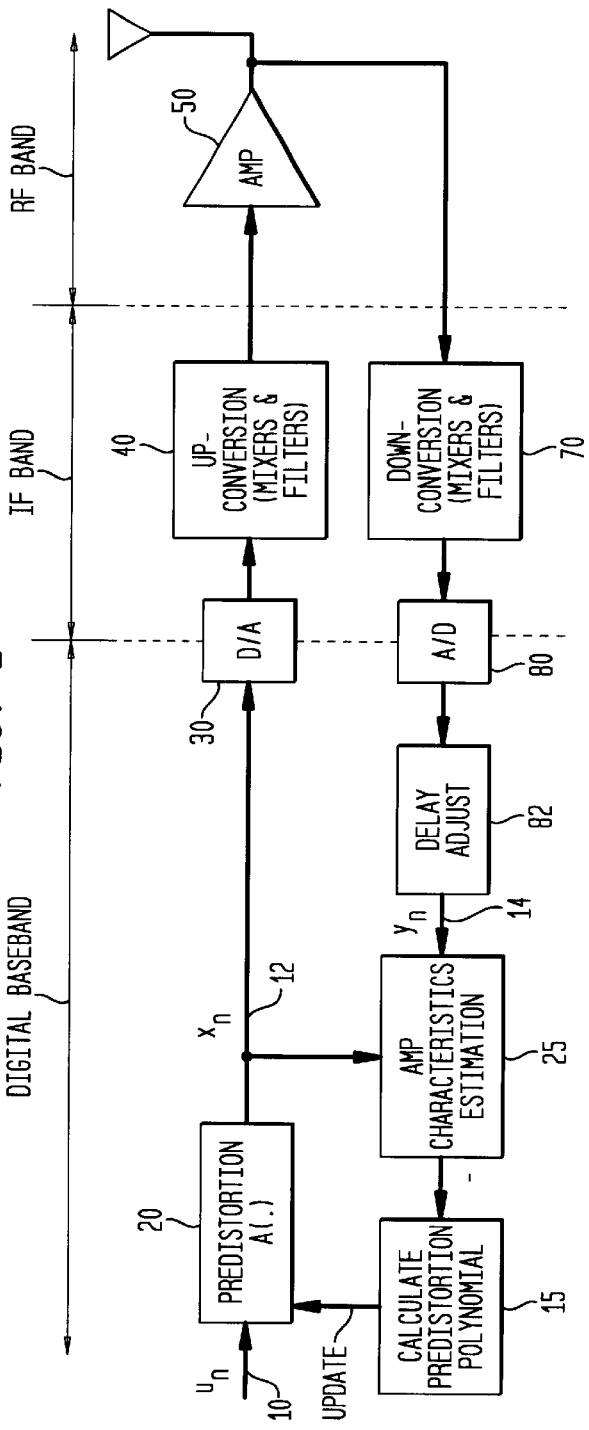
FIG. 1 is a block diagram providing an overview of an exemplary system employing adaptive power amplifier predistortion.

The principal benefit of the present invention is the ability to more efficiently model the power amplifier characteristics in order to improve the ability to employ adaptive digital predistortion (ADPD). The structure of an exemplary ADPD system is seen in FIG. 1. An initial baseband digital signal 10 is identified as $u_n$, where n is the time index. The initial baseband digital signal 10 is fed into a predistortion system 20 that is described as a function A(.). The output of the predistortion system 20 is the baseband digital input signal 12 to the power amplifier 50 and is defined as $x_n$. The baseband digital input signal 12 is processed by a digital to analog (D/A) converter 30 with the resulting baseband analog signal being processed by an up-conversion means 40 that is comprised of mixers and filters and operates in the intermediate frequency (IF) range. The up-conversion means 40 outputs a signal in the radio frequency (RF) range and feeds the signal to the power amplifier 50. While there are many methods for ADPD, the approach with the exemplary invention can be divided into two steps. First, the characteristics of the power amplifier 50 are estimated. Then, the predistortion function based on the power amplifier's 50 characteristics is obtained. For proper characterization of the power amplifier 50, the time domain inputs and outputs of the power amplifier 50 need to be compared. Thus, the output of the power amplifier 50 is tapped and fed back to a down-conversion means 70. Like the up-conversion means 40, the down-conversion means 70 requires mixers and filters in the IF range. The output of the down-conversion means 70 is fed into an analog to digital (A/D) converter 80. The output of the A/D converter 80 is input into a means for delay adjustment 82 with its output representing the baseband digital output signal 14 identified as $y_n$. The baseband digital output signal 14 and the baseband digital input signal 12 are input to the polynomial module 25 in order to determine the coefficients that characterize the power amplifier 50. The output of the polynomial module 25 is coupled to the predistortion polynomial module 15 that determines the predistortion coefficients that are fed into the predistortion module 20.

As implemented in FIG. 1, the baseband digital input signal 12 to the power amplifier 50 as well as the baseband digital output signal 14 of the power amplifier 50 are easily accessible. However, the up-conversion means 40 and the down-conversion means 70 distort the signals. Mixers are nonlinear devices and will add non-linear distortions. Furthermore, the phase responses of analog filters are not linear, thereby causing different time delays for different frequency components. Generally, these distortions can be considered negligible or can be corrected by using linear filters, and considered to be part of the baseband model for the power amplifier.

Figure 2:
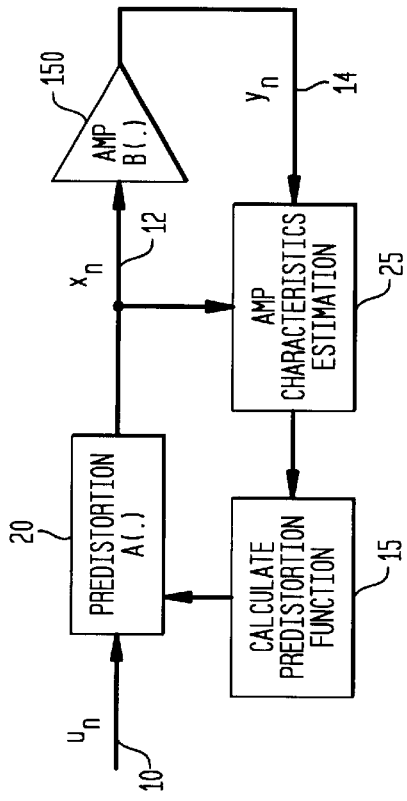
FIG. 2 is a block diagram of the simplified baseband model for power amplifier predistortion.

By neglecting the effect of up-conversion and down-conversion process, the whole predistortion process can be considered in the baseband domain. In FIG. 2, an exemplary baseband model for predistortion processing is illustrated. The power amplifier 150 is defined as a baseband function B(.) with complex inputs and complex outputs.

Calculation of Predistortion Function

Figure 3:
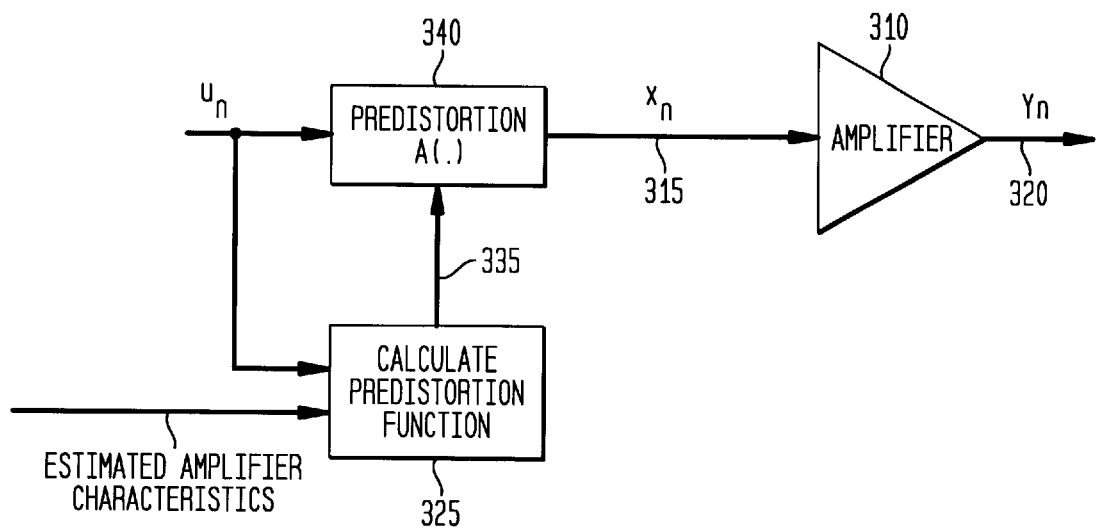
FIG. 3 is a block diagram of a power amplifier employing a predistortion linearization technique in accordance with the principles of the present invention.

FIG. 3 illustrates a block diagram 300 of a power amplifier 310 employing a predistortion linearization technique in accordance with the principles of the present invention.

In FIG. 3, the power amplifier 310 comprises an input 315 and an output 320. The power amplifier 310 can be any suitable commercially available power amplifier. An output 335 of the predistortion function calculating module 325 is coupled to a predistortion module 340. The predistortion module 340 can receive an input signal, $u_n$. An output of the predistortion module 340 is coupled to the input 315 of the power amplifier 310 to complete the predistortion linearization implementation. The predistortion module and predistortion function calculating module may both be implemented in hardware, or in other forms such as software or firmware.

In general, predistortion module 340 performs the function of combining the input signal $u_n$ with the distortion compensating values received from predistortion function calculating module 325 to produce a predistorted signal $x_n$, which is then provided to the power amplifier 310. The power amplifier 310 amplifies the predistorted input signal $x_n$, applying its own distortion characteristics, and the resultant output signal $y_n$ from the power amplifier 310 is an amplified signal with substantially all distortion removed.

The operation of the predistortion function calculating module 325 and the predistortion module 340 are now discussed in more detail.

First, a quick discussion of polynomial modeling of power amplifiers without memory is necessary. If it is assumed that power amplifier is operating in the radio frequency (RF) domain, then the baseband model of the power amplifier as shown in FIG. 3, must be considered in complex numbers. Let x and y be the complex input and output of a power amplifier 310, respectively. The relationship can then be modeled as:

$$y = B(x) = b_1 x + b_2 |x| x + b_3 |x|^2 x + \ldots + b_p |x|^{p-1} x = (b_1 + b_2 |x| + b_3 |x|^2 + \ldots + b_p |x|^{p-1}) \cdot x = \beta(|x|) \cdot x \quad (1)$$

where $\{b_1, b_2, \ldots, b_p\}$ are complex numbers, p is the order of the polynomial and $\beta(|x|)$ is a complex number and a function of $|x|$.

The power amplifier model described above has the same characteristics over different frequency ranges. However, as the bandwidth of the signal increases, actual power amplifiers have memory and its characteristics depend on signal frequencies. Memory, as it relates to a power amplifier, means that the output of the power amplifier is not only a function of the current input but also a function of past inputs. Thus, greater accuracy in modeling a power amplifier can be achieved if memory impacts as well as non-linear responses are accommodated. Let $x_n$ be a particular instance of the input of the power amplifier 310 and $y_n$ be the corresponding output sample, where n is a member of the set $\{1, 2, \ldots\}$ and is the time index. M is the order of the power amplifier memory. Thus, M is equal to the number of delay terms used to model past instances of input. The delay terms can be realized with delay taps to insure that the past instances of input are properly synchronized. The relations are modeled as:

$$y_n = \sum_{m=0}^{M-1} B_m(\overline{b_m}, x_{n-m}) \quad (2)$$

where, $$B_m(\vec{b}_m, x_{n-m}) = b_{m1} x_{n-m} + b_{m1} |x_{n-m}| x_{n-m} + b_{m1} |x_{n-m}|^2 x_{n-m} + \ldots + b_{mp_m} |x_{n-m}|^{p_m-1} x_{n-m} = (b_{m1} + b_{m2} |x_{n-m}| + b_{m2} |x_{n-m}|^2 + \ldots + b_{mp_m} |x_{n-m}|^{p_m-1}) \cdot x_{n-m} = \beta_m(|x_{n-m}|) \cdot x_{n-m} \quad (3)$$

where $p_m$ is the order of the polynomial $B_m(\vec{b}_m, x_{n-m})$. The components of the vector $\vec{b}_m$, $\{b_{m1}, b_{m2}, \ldots, b_{mp}\}$, are complex numbers. $\beta_m(|x_{n-m}|)$ is a complex number and a function of $|x_{n-m}|$.

Given the above power amplifier model, the predistortion function can be calculated by obtaining the inverse function of the polynomial in equation (2). This is denoted as A(.) in FIG. 1. By using equation (3), equation (2) now becomes:

$$y_n = \sum_{m=0}^{M-1} \beta_m(|x_{n-m}|) \cdot x_{n-m} \quad (4)$$

Then $x_n$ can be expressed in terms of $y_n$ and $x_{n-m}$, m being member of the set $\{1, 2, \ldots, M-1\}$ as follows:

$$x_n = \frac{1}{\beta_0(|x_n|)} \left( y_n - \sum_{m=1}^{M-1} \beta_m(|x_{n-m}|) \cdot x_{n-m} \right) \quad (5)$$

Let $u_n$ and $x_n$ be the input and output of predistortion module 340, respectively. Noting that in an ideal predistortion linearization process, the output $y_n$ of power amplifier 310 is the same as the input $u_n$ of predistortion module 340, the predistortion function can be described as:

$$x_n = \frac{1}{\beta_0(|x_n|)} \left( u_n - \sum_{m=1}^{M-1} \beta_m(|x_{n-m}|) \cdot x_{n-m} \right) \quad (6)$$

The problem of equation (6) is that it is necessary to know the value of $|x_n|$ to calculate $x_n$. In the low power area, $|u_n|$ is very close to $|x_n|$. Even at or near saturation, the difference between $|u_n|$ and $|x_n|$ are less than 10% of $|x_n|$. Thus, $|u_n|$ can be used to obtain the estimate $\tilde{x}_{nn}$ of $x_n$ instead of $|x_n|$. The estimate of $x_n$ is then substituted in for the argument of $\beta_0(\ )$ in Equation 6. The procedure is as follows:

Step 1. Calculate the estimate of $x_n$ by using $\beta_0(|u_n|)$ instead of $\beta_0(|x_n|)$ in Equation (6).

Step 2. Calculate a better estimate, $\tilde{x}_n$, by using $\beta_0(|\tilde{x}_n|)$ instead of $\beta_0(|x_n|)$ in Equation (6).

Step 3. Repeat Step 2 a given number of iterations. Use the final value of the estimate of $x_n$ as $x_n$. (After running various simulations, it was determined that one or two iterations were enough).

In Step 1, a magnitude of the input signal at a given time is used as an estimate of the predistorted signal, and particularly of the magnitude of the predistorted signal, at that given time. In Step 2, the predistortion function calculation, responsive to the amplifier characteristics, uses the estimate. That use generates an approximation $\tilde{x}_n$ of the predistorted signal at that given time. In Step 3, the approximation is used iteratively in calculating a predistortion function. The predistortion module responds to the predistortion function and the input signal by generating a predistorted signal. If the amplifier characteristics are later updated, a corresponding recalculation of the predistortion function occurs, the recalculation being based also on the magnitude of the input signal at that later time. The predistortion function, as recalculated, is available for use by the predistortion module.

Figure 4:
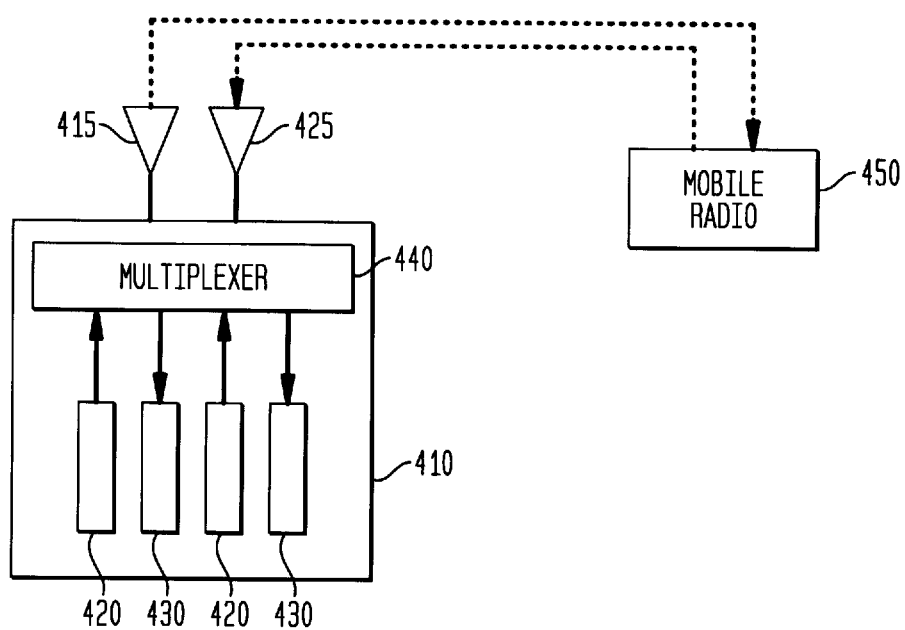
FIG. 4 is a block diagram illustrating the power amplifier of FIG. 3 as used in a RF transmission system in accordance with the principles of the present invention.

FIG. 4 illustrates a base station 410 having power amplifiers employing a predistortion linearization technique in accordance with the principles of the present invention.

As shown in FIG. 4, base station 410 comprises a pair of transmitters 420 each having a power amplifier as shown in FIG. 3. Base station 410 can comprise, if necessary, a single transmitter or additional transmitters. In addition, base station 410 includes a suitable transmit antenna 415 for transmission in a RF transmission system that comprises both wireless and wired equipment. Base station 410 can utilize any equipment suitable for sending and receiving RF transmissions, such as those employing Code Division Multiple Access (CDMA) communications. In FIG. 4, a mobile radio 450 is shown as well as the base station 410 including a receive antenna 425, a pair of receivers 430 and a multiplexer 440. Additional mobile radios may be serviced by the base station 410, and it will be apparent to one of ordinary skill that base station 410 can be used for providing wireless communications in any desired manner and for any type of wireless communications protocol or standard.

Numerous modifications and alternative embodiments of the invention will be apparent to those skilled in the art in view of the foregoing description. For example, although an amplifier with memory is described, the iteration technique of the present invention is applicable to amplifiers without memory. Accordingly, this description is to be construed as illustrative only and is for the purpose of teaching those skilled in the art the best mode of carrying out the invention. Details of the structure may be varied substantially without departing from the spirit of the invention and the exclusive use of all modifications that come within the scope of the appended claim is reserved.

What is claimed is:

1. An apparatus for calculating a predistortion function from characteristics of a power amplifier, comprising:
    a predistortion module responsive to a predistortion function and an input signal by generating a predistorted signal;
    the power amplifier responsive to said predistorted signal by generating an output signal; and
    a predistortion function calculating module responsive to said amplifier characteristics by generating said predistortion function without using the generated predistorted signal, said predistortion function calculating module using a magnitude of said input signal at a given time to estimate said predistorted signal at said given time to calculate said predistortion function.

2. The apparatus of claim 1, wherein said predistortion function calculating module uses a magnitude of said estimate of said predistorted signal in said calculating of said predistortion function.

3. The apparatus of claim 2, wherein said use of said magnitude of said estimate generates an approximation of said predistorted signal, and wherein said predistortion function calculating module uses said approximation in said calculating of said predistortion function.

4. The apparatus of claim 1, wherein said power amplifier has memory and is responsive to time-spaced samples of said predistorted signal.

5. The apparatus of claim 1, wherein said predistortion function is determined in said predistortion function calculating module by the equation $$x_n = \frac{1}{\beta_0(|x_n|)}\left(u_n - \sum_{m=1}^{M-1} \beta_m(|x_{n-m}|)\cdot x_{n-m}\right),$$

wherein "n" is a time index, wherein $x_n$ is a current value of said predistorted signal, wherein $u_n$ is a current value of said input signal, wherein $\beta$ is a complex polynomial representation of said power amplifier, wherein coefficients are generated for said complex polynomial representation for each of a plurality of delay taps, wherein M is an order of power amplifier memory equal to the number of said plurality of delay taps and wherein $|x_n|$ is estimated by $|u_n|$.

6. The apparatus of claim 1, wherein the predistortion function calculating module generates said predistortion function by using an estimated predistortion signal, the estimated predistortion signal calculated using at least the input signal.

7. A wireless radio frequency communications system including an apparatus for calculating a predistortion function from characteristics of a power amplifier with memory, comprising:
    a predistortion module responsive to a predistortion function and an input signal by generating a predistorted signal;
    the power amplifier responsive to said predistorted signal by generating an output signal; and
    a predistortion function calculating module responsive to said power amplifier characteristics by generating said predistortion function without using the generated predistorted signal, said predistortion function calculating module using a magnitude of said input signal at a given time to estimate said predistorted signal at said given time to calculate said predistortion function.

8. The system of claim 7, wherein said predistortion function calculating module uses a magnitude of said estimate of said predistorted signal in said calculating of said predistortion function.

9. The system of claim 8, wherein said use of said magnitude of said estimate generates an approximation of said predistorted signal, and wherein said predistortion function calculating module uses said approximation in said calculating of said predistortion function.

10. The system of claim 7, wherein said power amplifier has memory and is responsive to time-spaced samples of said predistorted signal.

11. The system of claim 7, wherein said predistortion function is determined in said predistortion function calculating module by the equation $$x_n = \frac{1}{\beta_0(|x_n|)}\left(u_n - \sum_{m=1}^{M-1} \beta_m(|x_{n-m}|)\cdot x_{n-m}\right),$$

wherein "n" is a time index, wherein $x_n$ is a current value of said predistorted signal, wherein $u_n$ is a current value of said input signal, wherein $\beta$ is a complex polynomial representation of said power amplifier, wherein coefficients are generated for said complex polynomial representation for each of a plurality of delay taps, wherein M is an order of power amplifier memory equal to the number of said plurality of delay taps and wherein $|x_n|$ is estimated by $|u_n|$.

12. The system of claim 7, wherein the predistortion function calculating module generates said predistortion function by using an estimated predistortion signal, the estimated predistortion signal calculated using at least the input signal.

13. A method for calculating a predistortion function from characteristics of a power amplifier with memory, comprising the steps of:
    generating a predistorted signal in response to a predistortion function and an input signal;
    generating an output signal in response to said predistorted signal; and
    generating a predistortion function in response to said power amplifier characteristics without using the generated predistorted signal, said step of generating a predistortion function including the step of substituting a magnitude of said input signal at a given time to estimate said predistorted signal at said given time to generate said predistortion function.

14. The method of claim 13, wherein said step of generating said predistortion function includes the step of using a magnitude of said estimate of said predistorted signal in calculating said predistortion function.

15. The method of claim 14, wherein said step of generating said predistortion function includes the step of generating an approximation of said predistorted signal from said use of said magnitude of said estimate and using said approximation in said calculating of said predistortion function.

16. The method of claim 15, wherein said step of generating an output signal includes the step of generating time-spaced samples of said predistorted signal, said output signal being responsive to said time-spaced samples.

17. The method of claim 13, wherein said step of generating said predistortion function is represented by the equation $$x_n = \frac{1}{\beta_0(|x_n|)}\left(u_n - \sum_{m=1}^{M-1} \beta_m(|x_{n-m}|) \cdot x_{n-m}\right),$$

wherein "n" is a time index, wherein $x_n$ is a current value of said predistorted signal, wherein $u_n$ is a current value of said input signal, wherein β is a complex polynomial representation of said power amplifier, wherein coefficients are generated for said complex polynomial representation for each of a plurality of delay taps, wherein M is an order of power amplifier memory equal to the number of said plurality of delay taps and wherein $|x_n|$ is estimated by $|u_n|$.

18. The method of claim 13, wherein said step of generating a predistortion function includes using an estimated predistortion signal, the estimated predistortion signal calculated using at least the input signal.

19. An apparatus for calculating a predistortion function from a characteristics curve of a power amplifier, comprising:

a predistortion module responsive to a predistortion function representative of an inverse to said characteristics curve and an input signal by generating a predistorted signal;

the power amplifier responsive to said predistorted signal by generating an output signal; and a predistortion function calculating module responsive to said power amplifier characteristics curve by generating said predistortion function without using the generated predistorted signal, said predistortion function calculating module using a magnitude of said input signal at a given time as an estimate of said predistorted signal at said given time to calculate said predistortion function.

20. The apparatus of claim 19, wherein said predistortion function calculating module uses a magnitude of said estimate of said predistorted signal in said calculating of said predistortion function.

21. The apparatus of claim 19, wherein said power amplifier has memory and is responsive to time-spaced samples of said predistorted signal.

22. The apparatus of claim 19, wherein the predistortion function calculating module generates said predistortion function by using an estimated predistortion signal, the estimated predistortion signal calculated using at least the input signal.

* * * * *